(12) United States Patent
Okuda et al.

(10) Patent No.: US 7,009,539 B2
(45) Date of Patent: Mar. 7, 2006

(54) MODULATOR PROVIDING ONLY QUANTIZATION ERROR COMPONENT TO DELTA SIGMA MODULATOR

(75) Inventors: Takashi Okuda, Hyogo (JP); Toshio Kumamoto, Hyogo (JP); Yasuo Morimoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/715,456

(22) Filed: Nov. 19, 2003

(65) Prior Publication Data

US 2004/0178937 A1    Sep. 16, 2004

(30) Foreign Application Priority Data

Mar. 11, 2003    (JP)    ............... 2003-065444

(51) Int. Cl.
    *H03M 3/00*    (2006.01)
(52) U.S. Cl. .................. 341/143; 341/144; 341/155
(58) Field of Classification Search ......... 341/143–144
    See application file for complete search history.

(56) References Cited

U.S. PATENT DOCUMENTS

| | | | | |
|---|---|---|---|---|
| 4,704,600 A | * | 11/1987 | Uchimura et al. | ......... 341/122 |
| 4,862,169 A | * | 8/1989 | van Bavel et al. | ......... 341/143 |
| 5,030,952 A | * | 7/1991 | Ledzius et al. | ............. 341/143 |
| 5,061,928 A | * | 10/1991 | Karema et al. | ............. 341/143 |
| 5,068,661 A | * | 11/1991 | Kaneaki et al. | ............. 341/143 |
| 5,103,229 A | * | 4/1992 | Ribner | ....................... 341/143 |
| 5,153,593 A | * | 10/1992 | Walden et al. | .............. 341/143 |
| 5,629,701 A | * | 5/1997 | Ritoniemi et al. | ......... 341/143 |
| 6,300,890 B1 | * | 10/2001 | Okuda et al. | ............... 341/143 |

FOREIGN PATENT DOCUMENTS

| | | |
|---|---|---|
| JP | 3-22626 | 1/1991 |
| JP | 6-53836 | 2/1994 |
| JP | 11-308110 | 11/1999 |
| JP | 2002-76902 | 3/2002 |

OTHER PUBLICATIONS

Gabor C. Temes et al., "Architectures for ΔΣ DACs," Delta-Sigma Data Converters, IEEE Press, 1997, pp. 309-313.

David Johns et al., "Analog Integrated Circuit Design," John Wiley & Sons Inc., 1997, pp. 547-551, 568-571.

Gabor C. Temes et al., "Architectures for ΔΣ DACs," Delta-Sigma Data Converters, IEEE Press, 1997, pp. 309-313, no month.

David Johns et al., "Analog Integrated Circuit Design," John Wiley & Sons Inc., 1997, pp. 547-551, 568-571, no month.

* cited by examiner

*Primary Examiner*—Peguy JeanPierre
*Assistant Examiner*—Khai Nguyen
(74) *Attorney, Agent, or Firm*—Buchanan Ingersoll PC

(57) ABSTRACT

A ΔΣ modulator modulates only an error component separated by a component separating portion. Therefore, even if the number of order of the ΔΣ modulator increases, an amplitude of an output of an integrator in the final stage does not excessively increase, and the stability of the modulator can be achieved. Since the signal component separated by the component separating portion does not pass through the ΔΣ modulator, an intensity of an input signal can be maintained as it is, and the modulator can have high precision.

8 Claims, 9 Drawing Sheets

EXAMPLE OF INTEGRATOR nth MODULATOR
(n:LARGE)

MODULATOR PROVIDING ONLY QUANTIZATION ERROR COMPONENT TO DELTA SIGMA MODULATOR

BACKGROUND OF THE INVENTION

1. Field of the Invention

The present invention relates to a modulator employing an oversampling $\Delta\Sigma$ converting method, which has been widely used in A/D (Analog-to-Digital) converters and D/A (Digital-to-Analog) converters for an audio band or range. Particularly, the invention relates to a modulator, which can reduce suppression of an input signal in a high order, and thereby can achieve high precision and improved stability in this conversion method.

2. Description of the Background Art

Modulators of an oversampling $\Delta\Sigma$ conversion method are now widely used for A/D converters and D/A converters, which may be referred to as "ADCs" and "DACs" hereinafter, respectively, for the audio band. As will be described later, the oversampling $\Delta\Sigma$ modulator is formed of a delay element, an integrator, an adder and a quantizer.

Japanese Patent Laying-Open Nos. 3-22626, 11-308110, 6-53836 and 2002-76902 have disclosed inventions relating to the above technology.

Japanese Patent Laying-Open No. 3-22626 has disclosed a fourth $\Delta\Sigma$ converter, which is formed of a primary loop and secondary loops. An output F of the main loop is expressed by the following formula:

$$F = X(z) + (1-z^{-1})^2 \cdot Q_1(z) \quad (1)$$

where $X(z)$ represents an input signal, and $Q_1(z)$ represents quantization noises of a first quantizer.

If the first quantizer is formed of a simple comparator, the following relationship is present between its input E and output F:

$$F = E + Q_1(z) \quad (2)$$

$$-Q_1(z) = E - F \quad (3)$$

In the secondary loop, a quantization error $-Q_1(z)$ is integrated according to secondary transfer characteristics. A quantization output G is expressed by the following formula:

$$G = -Q_1(z) + (1-z^{-1})^2 \cdot Q_2(z) \quad (4)$$

where $Q_2(z)$ expresses quantization noises of a second quantizer.

In this secondary loop, first and second differentiators are arranged downstream from the secondary quantizers, and differentiate quantization output G twice. An output H after the two differentiating operations is as follows:

$$H = -(1-z^{-1})^2 \cdot Q_1(z) + (1-z^{-1})^4 \cdot Q_2(z) \quad (5)$$

where $(1-z^{-1})$ represents a transfer function of the first and second differentiators.

By adding this output H of the secondary loop to output F of the primary loop, $(1-z^{-1})^2 \cdot Q_1(z)$ in the formula (1) cancels $(-(1-z^{-1})^2 \cdot Q_1(z))$ in the formula (5) so that a final output $Y(z)$ is expressed by the following formula:

$$Y(z) = X(z) + (1-z^{-1})^4 \cdot Q_2(z) \quad (6)$$

In this manner, the $\Delta\Sigma$ converter of a quadruple-integration type is equivalently achieved.

Japanese Patent Laying-Open No. 11-308110 has disclosed a $\Delta\Sigma$-type A/D converter, which includes a plurality of cascaded delta-sigma loops for noise shaving and reduction of quantization noises.

Japanese Patent Laying-Open No. 6-53836 has disclosed an analog-to-digital converter circuit, which performs multiplication with ($a \leq 1$) by a factor multiplier, and performs restoration to an original size by the factor multiplier so that an input signal applied to the integrator of the delta-sigma A/D converter loop for the correction may be reduced.

Japanese Patent Laying-Open No. 2002-76902 has disclosed a prior art, in which a decimation filter arranged in a downstream position removes a noise power distributed outside an signal band.

As will be described later, an effect by modulation depends on the number of bit of the quantizers, or the number (order) of the feedback stages following the output of the integrator and quantizer. Thus, a higher order of the feedback stage increases the effect by the modulation if the number of bits of the quantizer is constant, and thus can achieve more precise modulation. However, a higher order of the modulator may excessively increase an amplitude of an output of the integrator in the final stage, resulting in a problem that large oscillation occurs.

In any one of the foregoing prior arts, since an original signal is provided to the modulator of the primary loop, the foregoing problems cannot be overcome.

SUMMARY OF THE INVENTION

An object of the invention is to provide a modulator, which can improve stability and precision.

A modulator according to an aspect of the invention is a modulator using a delta-sigma conversion method, and includes a component separating portion separating a signal component and an error component of an input signal from each other, a delta-sigma modulator modulating the error component separated by the component separating portion, and an output operating portion operating the signal component separated by the component separating portion and the error component modulated by the delta-sigma modulator.

Since the delta-sigma modulator modulates only the error component separated by the component separating portion, an amplitude of an output of an integrator in a final stage does not increase excessively even if the number of order of the delta-sigma modulator is increased. Therefore, stability of the modulator can be achieved. Further, the signal component separated by the component separating portion does not pass through the delta-sigma modulator so that the intensity of the input signal can be maintained as it is, and high precision can be achieved in the modulator.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
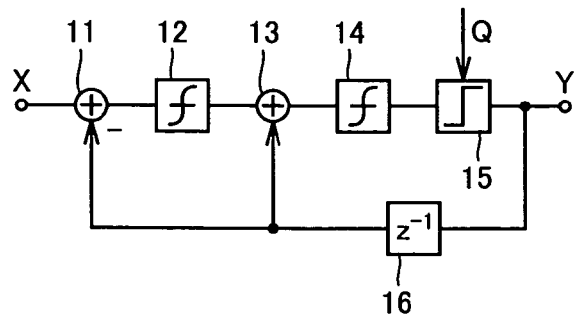
FIGS. 1A and 1B are block diagrams showing an example of a structure of an oversampling $\Delta\Sigma$ modulator.
Figure 1B:
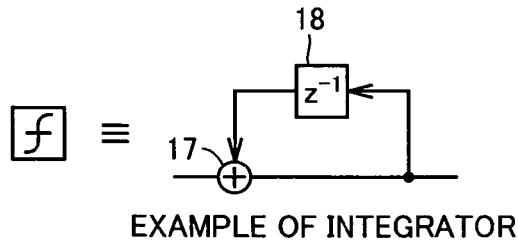

FIGS. 1A and 1B are block diagrams showing by way of example a structure of an oversampling ΔΣ modulator. As shown in FIG. 1A, the ΔΣ modulator includes adders 11 and 13, integrators 12 and 14, a one-bit quantizer 15 and a delay element 16. As shown in FIG. 1B, each of integrators 12 and 14 includes an-adder 17 and a delay element 18.

Figure 2:
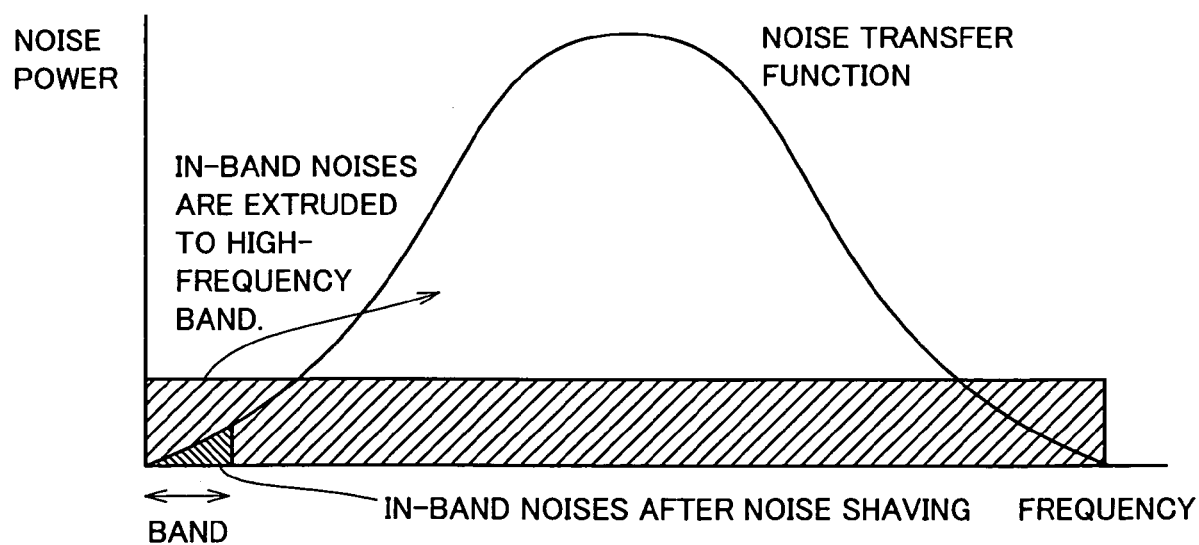
FIG. 2 illustrates a concept of modulation of quantization noises in the $\Delta\Sigma$ modulator.

FIG. 2 illustrates a concept of modulation of quantization noises in the ΔΣ modulator. The quantization noises occurring in quantizer 15 are subjected to modulation so that the quantization noises within a band are extruded to a high-frequency band. Thereby, even a quantizer of a small number of bits can achieve a D/A or A/D converter with high precision. Thus, large quantization errors occurring in the quantizer of the small number of bits are extruded to a high band so that the noises within the band (low range) is reduced in amount, and the precision of the ΔΣ modulator is improved.

FIG. 1A shows the second-order modulator. However, increase in number of the order of the modulator may excessively increase an amplitude of an output of an integrator in a final stage so that oscillation is liable to occur, resulting in deterioration of stability.

Figure 3:
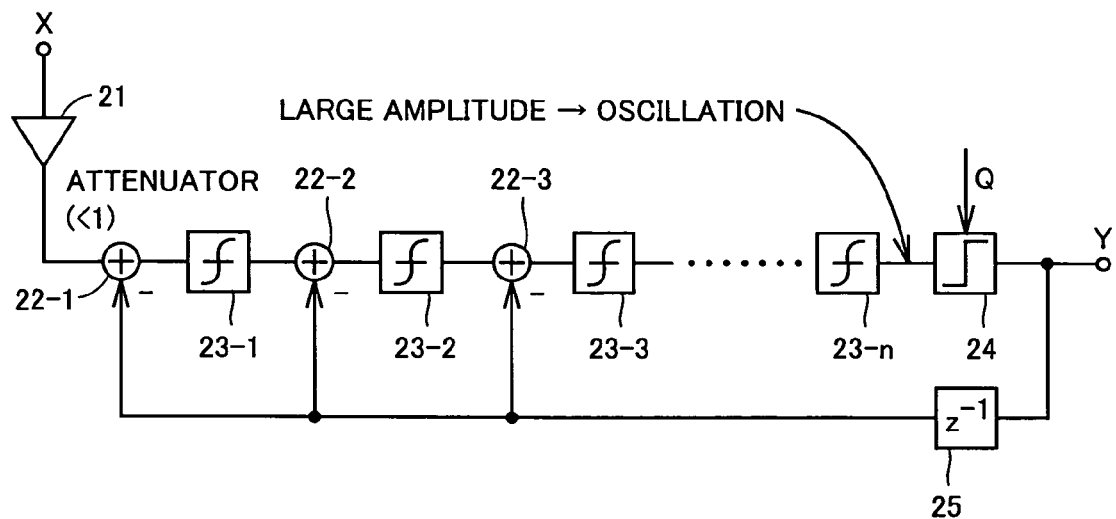
FIG. 3 illustrates a general method for overcoming a problem occurring in the $\Delta\Sigma$ modulator shown in FIG. 1.

FIG. 3 illustrates a general manner for overcoming a problem arising in the ΔΣ modulator shown in FIGS. 1A and 1B. This high-order (nth) ΔΣ modulator includes an attenuator 21, adders 22-1–22-n, integrators 23-1–23-n, a quantizer 24 and a delay element 25.

In FIG. 3, attenuator 21 having a coefficient not exceeding one is arranged before the high-order (nth) ΔΣ modulator for preventing an excessive amplitude of the output of the integrator in the final stage. Output signal Y can be expressed by the following formula:

$$Y=bX+(1-z^{-1})^n \cdot Q \quad (7)$$

where X represents an input signal, Q represents an quantization error and b represents a coefficient of attenuator 21.

As described above, the arrangement of attenuator 21 can improve the stability, but restricts the output amplitude. This results in a problem that the precision to be originally achieved by the modulator cannot be achieved. As the order of the modulator becomes higher, attenuator 21 has a coefficient of a lower value, which makes the above problem more remarkable.

(First Embodiment)

Figure 4:
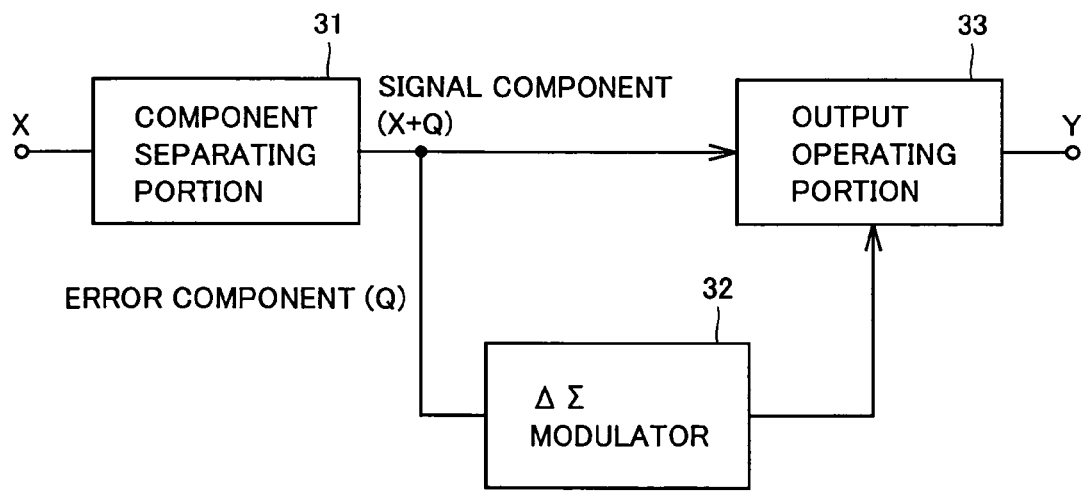
FIG. 4 is a block diagram showing a schematic structure of a modulator of a first embodiment of the invention.

FIG. 4 is a block diagram showing a schematic structure of a modulator of a first embodiment of the invention. This modulator includes a component separating portion 31, which separates a quantized signal component (X+Q) and a quantization error component (Q) of the input signal (X) from each other, a ΔΣ modulator 32 modulating only quantization error component (Q), and an output operating portion 33 performing an arithmetic operation on quantized signal component (X+Q) and the output of ΔΣ modulator 32.

ΔΣ modulator 32 modulates only the error component. Therefore, even if the order of ΔΣ modulator 32 becomes high, the amplitude of the output of the final integrator does not excessively increase, and the stability of the modulator can be achieved. Further, output operating portion 33 performs an operation on quantized signal component (X+Q), which is separated by component separating portion 31, and the output of ΔΣ modulator 32 so that the quantization error component Q is cancelled. Since the input of the modulator is quantization error component Q, the amplitude is small, and increase in output of the final integrator can be prevented. Therefore, it is not necessary to arrange the attenuator before the modulator so that lowering of the signal intensity of output signal Y can be prevented, and the precision of the modulator can be improved.

Specific examples of the modulator according to the first embodiment will now be described. Second to fifth embodiments to be described below relate to digital ΔΣ modulators, respectively, and sixth to ninth embodiments relate to analog ΔΣ modulators, respectively.

(Second Embodiment)

Figure 5:
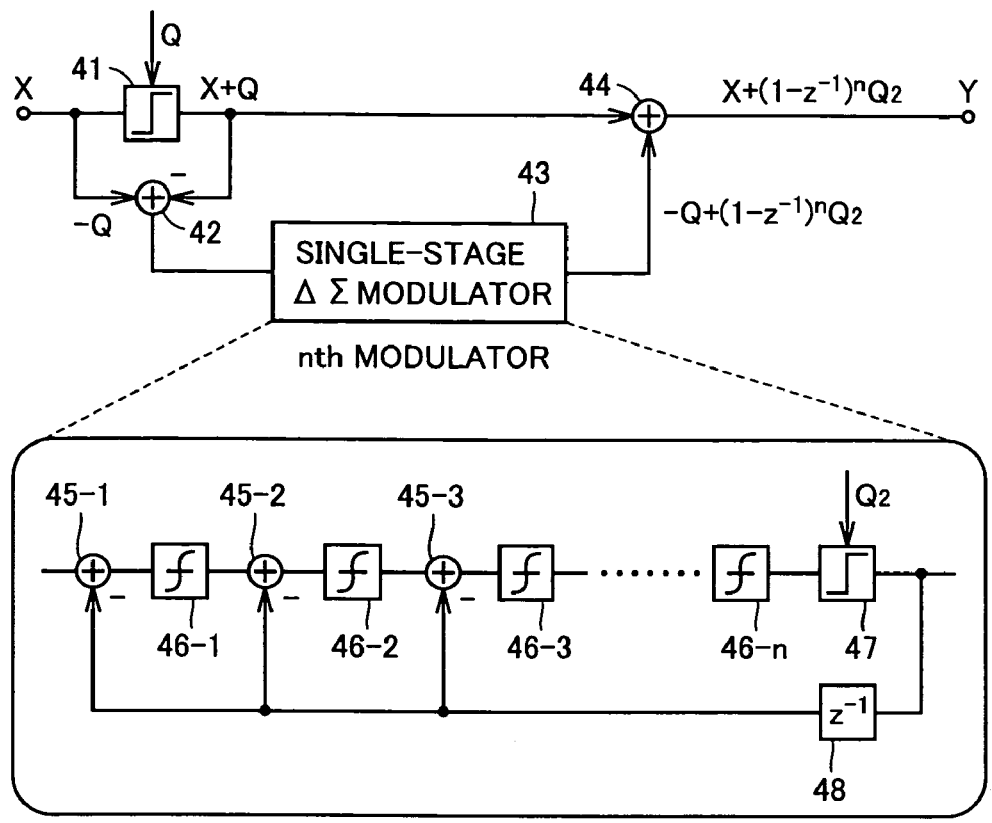
FIGS. 5 to 12 are block diagrams showing structures of modulators of second to ninth embodiments of the invention, respectively.

FIG. 5 is a block diagram showing a structure of a modulator according to a second embodiment of the invention. This modulator includes a quantizer 41 of one bit for quantizing a digital input signal X, an adder 42 adding input signal X to a quantized signal component (−(X+Q)) provided from quantizer 41, a single-stage ΔΣ modulator 43, and an adder 44 adding quantized signal component (X+Q) provided from quantizer 41 to the output signal of single-stage ΔΣ modulator 43.

Single-stage ΔΣ modulator 43 is an nth ΔΣ modulator including adders 45-1–45-n, integrators 46-1–46-n, a quantizer 47 and a delay element 48. The output of quantizer 47 is delayed by delay element 48, and then negative feedback is performed to provide it to integrators 46-1–46-n by adders 45-1–45-n.

Single-stage ΔΣ modulator 43 provides an output of $(-Q+(1-z^{-1})^n \cdot Q_2)$. Therefore, output signal Y is expressed by the following formula:

$$Y=X+(1-z^{-1})^n \cdot Q_2 \quad (8)$$

where $Q_2$ represents an error component occurring in single-stage ΔΣ modulator 43.

According to the modulator of the embodiment, as already described, adder 42 adds input signal X to quantized signal component (−(X+Q)) provided from quantizer 41, and supplies only quantization error component (−Q) to single-stage ΔΣ modulator 43. Therefore, the input of single-stage ΔΣ modulator 43 is substantially equal to half the original signal (X), and the stability of the modulator can be improved.

Quantized signal component (X+Q) provided from quantizer 41 is directly supplied to adder 44 without passing through single-stage ΔΣ modulator 43. Therefore, the intensity of input signal X can be maintained as it is, and the precision of the modulator can be improved.

This embodiment has been described in connection with the one-bit feedback method. However, the modulator may be of a multibit type, and another conversion method such as a feed-forward architecture may be employed. These type and method can achieve effects similar to those already described.

(Third Embodiment)

Figure 6:
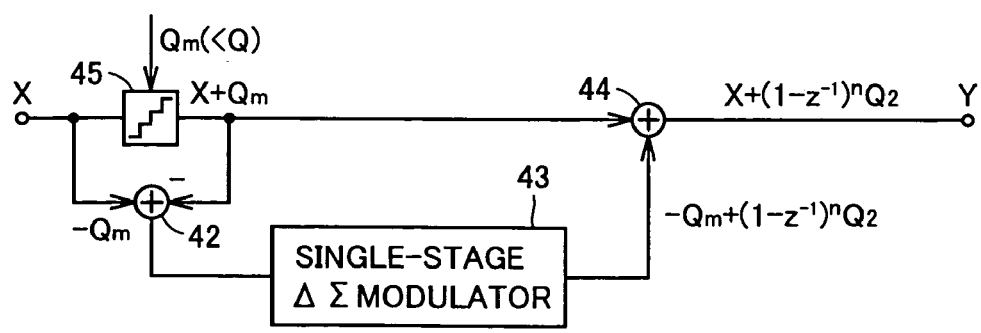

FIG. 6 is a block diagram showing a structure of a modulator of a third embodiment of the invention. This modulator differs from the modulator of the second embodiment shown in FIG. 5 only in that quantizer 41 is replaced with a multibit quantizer 45. Therefore, description of the same structures and functions is not repeated.

Multibit quantizer 45 quantizes input signal X to provide a quantized signal component $(X+Q_m)$. Adder 42 adds digital input signal X to quantized signal component $(-(X+Q_m))$ provided from multibit quantizer 45, and provides only quantization error component $(-Q_m)$ to single-stage $\Delta\Sigma$ modulator 43.

Single-stage $\Delta\Sigma$ modulator 43 provides an output of $(-Q_m+(1-z^{-1})^n \cdot Q_2)$. Output signal Y is the same as that expressed by the formula (8) in the first embodiment already described.

According to the modulator of this the embodiment, as described above, adder 42 adds input signal X to quantized signal component $(-(X+Q_m))$ provided from multibit quantizer 45, and provides only quantization error component $(-Q_m)$ to single-stage $\Delta\Sigma$ modulator 43. Since quantization error $Q_m$ can be smaller than quantization error Q in the second embodiment, the input of single-stage $\Delta\Sigma$ modulator 43 can be further reduced so that the stability of the modulator can be further improved as compared with the modulator of the second embodiment.

(Fourth Embodiment)

Figure 7:
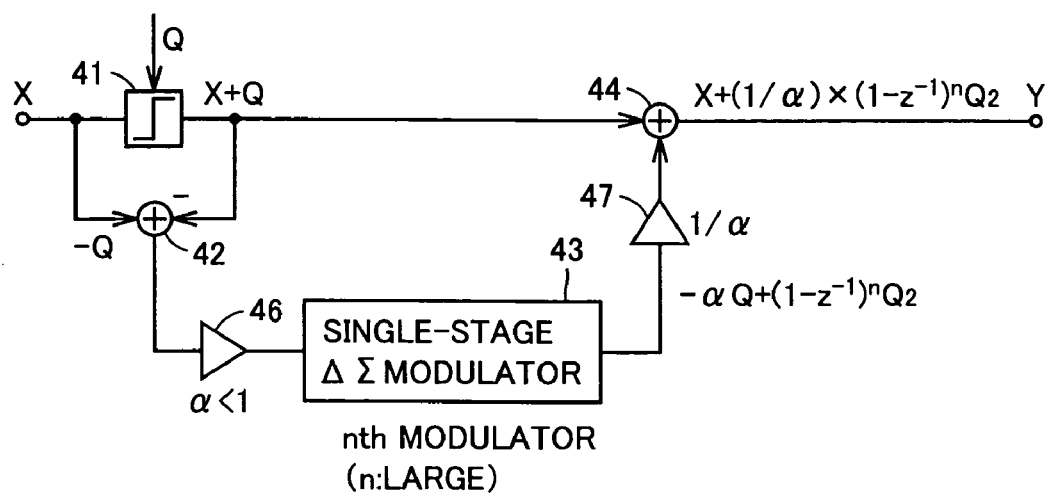

FIG. 7 is a block diagram showing a structure of a modulator of a fourth embodiment of the invention. This modulator differs from the modulator of the second embodiment shown in FIG. 5 only in that an attenuator 46 having a coefficient of $\alpha$ smaller than one is arranged in a stage preceding single-stage $\Delta\Sigma$ modulator 43, and an attenuator 47 having a coefficient of $1/\alpha$ is arranged in a stage following single-stage $\Delta\Sigma$ modulator 43. Therefore, description of the same structures and functions is not repeated.

As the number n of order of single-stage $\Delta\Sigma$ modulator 43 is increased, the amplitude of output of the integrator in the final stage increases, and oscillation may occur, even if an input amplitude of single-stage $\Delta\Sigma$ modulator 43 decreases. For preventing it, attenuator 46 is added to a position preceding single-stage $\Delta\Sigma$ modulator 43.

Owing to attenuator 46 having coefficient of $\alpha$, single-stage $\Delta\Sigma$ modulator 43 provides an output of $(-\alpha Q+(1-z^{-1})^n \cdot Q_2)$. Therefore, output signal Y is expressed by the following formula:

$$Y=X+(1/\alpha)\times(1-z^{-1})^n * Q_2 \qquad (9)$$

According to the modulator of the embodiment, as described above, attenuator 46 having a coefficient of $\alpha$ is added to the position preceding single-stage $\Delta\Sigma$ modulator 43, and attenuator 47 having a coefficient of $(1/\alpha)$ is added to the position following single-stage $\Delta\Sigma$ modulator 43. Therefore, it is possible to reduce an amplitude of the output of integrator 46-n in the final stage of single-stage $\Delta\Sigma$ modulator 43, and the oscillation of integrator 46-n can be prevented. Thus, it is possible to ensure the intended stability of the modulator while ensuring the intended amplitude of the modulator. The coefficient of $\alpha$ of attenuator 46 may be larger than the coefficient of attenuator 21 shown in FIG. 3 so that attenuator 46 may perform attenuation to a smaller extent.

(Fifth Embodiment)

Figure 8:
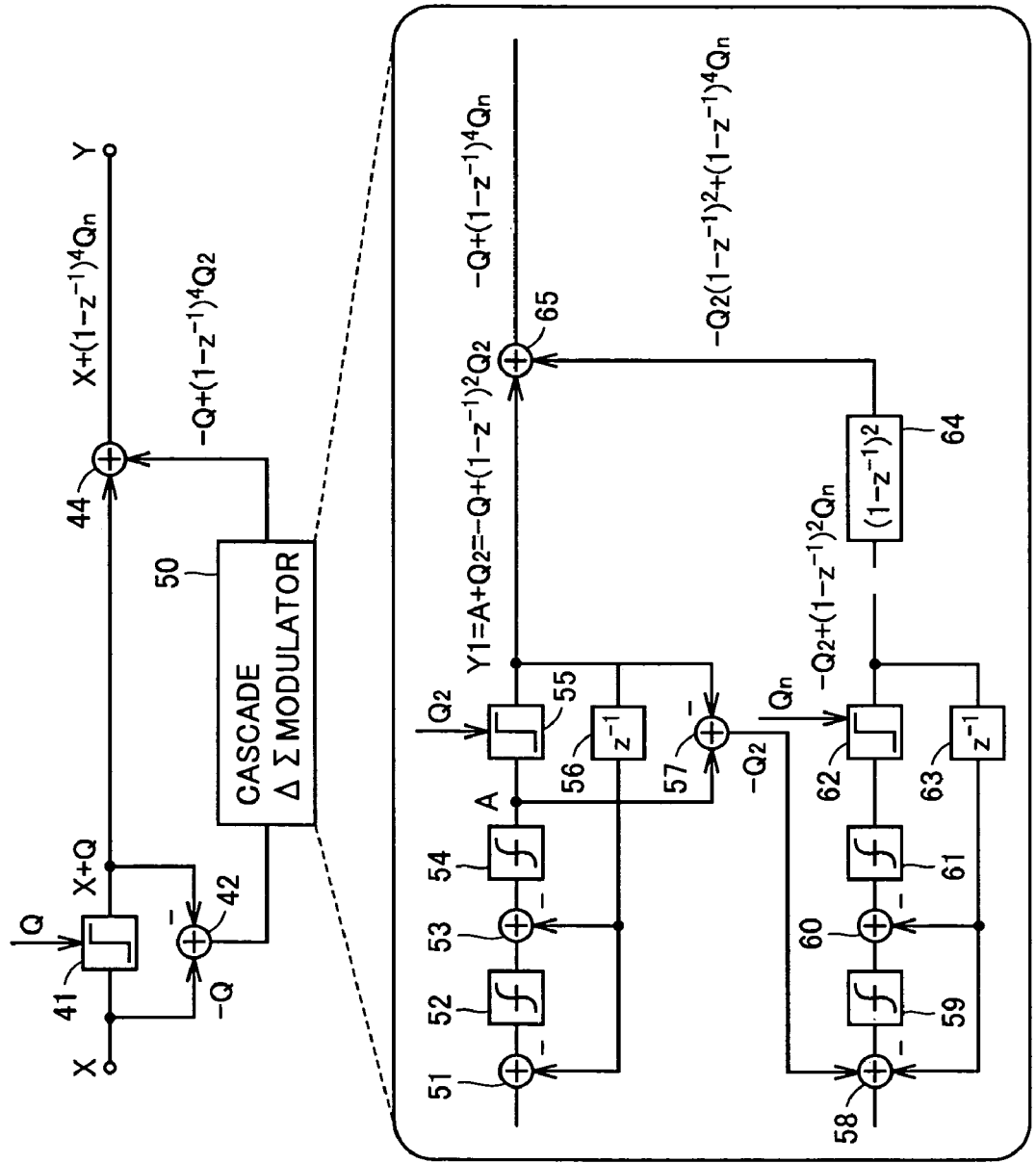

FIG. 8 is a block diagram showing a structure of a modulator of a fifth embodiment of the invention. This modulator differs from the modulator of the second embodiment shown in FIG. 5 only in that single-stage $\Delta\Sigma$ modulator 43 is replaced with a cascade $\Delta\Sigma$ modulator 50. Therefore, description of the same structures and functions is not repeated.

Cascade $\Delta\Sigma$ modulator 50 is formed of cascaded single-stage $\Delta\Sigma$ modulators, and includes adders 51, 53, 57, 58, 60 and 65, integrators 52, 54, 59 and 61, quantizers 55 and 62, delay elements 56 and 63, and a differentiator 64 performing differentiation twice.

An output Y1 of quantizer 55 is expressed by the following formula:

$$Y1 = A + Q_2 = -Q + (1-z^{-1})^2 \cdot Q_2 \qquad (10)$$

where A represents an input of quantizer 55, and $Q_2$ represents a quantization error of quantizer 55.

Adder 57 adds input A of quantizer 55 to an output $(-(A+Q_2))$ of quantizer 55 to provide quantization error $(-Q_2)$ of quantizer 55.

An output of quantizer 62 is expressed by $(-Q_2+(1-z^{-1})^2 \cdot Q_n)$, where $Q_n$ represents a quantization error of quantizer 62. Also, an output of differentiator 64 is expressed by $(-Q_2 \cdot (1-z^1)^2 + (1-z^1)^4 \cdot Q_n)$. Therefore, adder 65 provides an output of $(-Q_2+(1-z^{-1})^4 \cdot Q_n)$.

By the provision of the cascade $\Delta\Sigma$ modulator described above, quantization errors $(Q_2, Q_3, \ldots)$ occurring in the quantizers except for that in the final stage can be removed by addition of those of the neighboring stages. Therefore, the item of $(1/\alpha)$ in the formula (9) of the fourth embodiment already described can be removed.

According to the modulator of this embodiment, as described above, cascade $\Delta\Sigma$ modulator 50 is used to modulate quantization error component $(-Q)$. Therefore, the amplitude of the output of integrator 61 in the final stage of cascade $\Delta\Sigma$ modulator 50 can be reduced without using an attenuator, and the oscillation in integrator 61 can be prevented. Thus, the stability of the modulator can be ensured while ensuring the amplitude of the modulator.

This embodiment has been described in connection with the case where two one-bit secondary $\Delta\Sigma$ modulators of the feedback type are cascaded. However, the number of cascaded stages may be increased, and/or a multibit quantizer may be employed as the quantizer in the final stage so that a modulator having higher precision can be achieved. Further, the conversion method of the modulator may employ another type such as a feed-forward type. In these cases, effects similar to those already described can be achieved.

(Sixth Embodiment)

Figure 9:
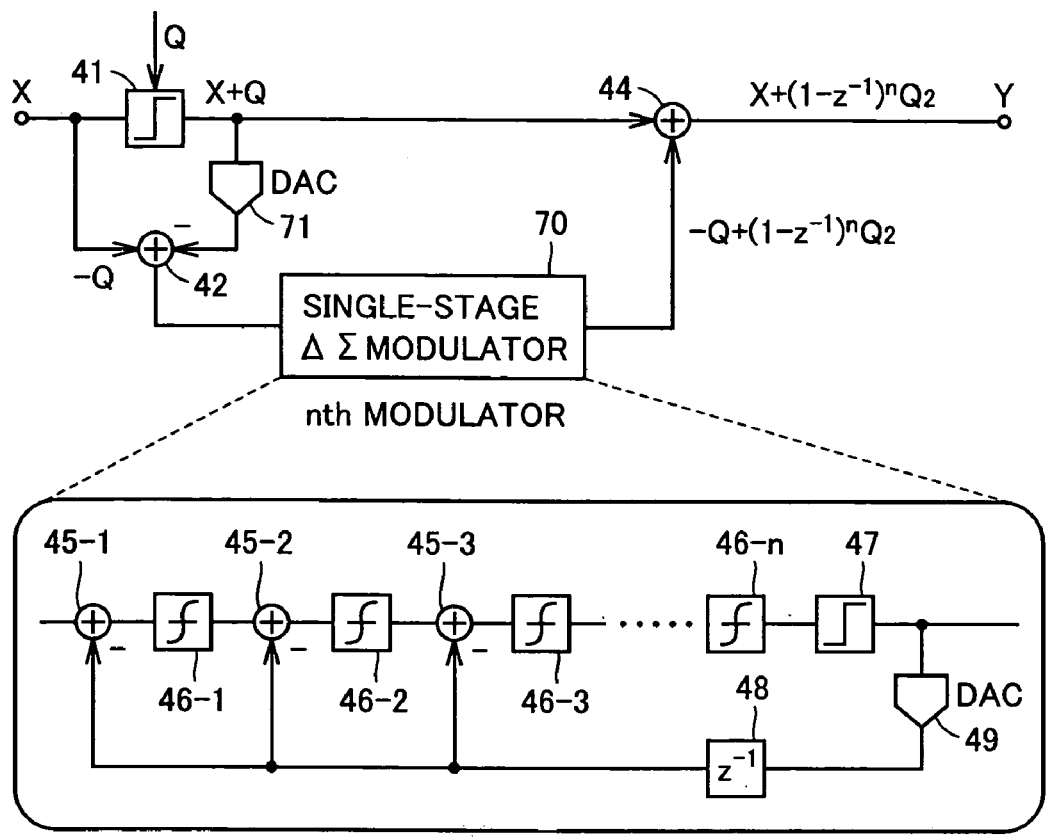

FIG. 9 is a block diagram showing a structure of a modulator according to a sixth embodiment of the invention. This modulator includes quantizer 41 (A/D converter) of one bit for quantizing analog input signal X, a D/A converter 71 converting quantized signal component (X+Q) provided from quantizer 41 to an analog signal, adder 42 adding input signal X to signal component $(-(X+Q))$ provided from D/A converter 71, a single-stage $\Delta\Sigma$ modulator 70, and adder 44 adding quantized signal component (X+Q) provided from quantizer 41 to the output signal of single-stage $\Delta\Sigma$ modulator 70.

Single-stage $\Delta\Sigma$ modulator 70 is an nth $\Delta\Sigma$ modulator including adders 45-1–45-n, integrators 46-1–46-n, quantizer 47, delay element 48 and a D/A converter 49 converting the output signal of quantizer 47 to an analog signal. The output of D/A converter 49 is delayed by delay element 48, and then negative feedback is performed to provide it to integrators 46-1–46-n by adders 45-1–45-n.

Single-stage $\Delta\Sigma$ modulator 70 provides an output of $(-Q+(1-z^{-1})^n \cdot Q_2)$. Therefore, output signal Y is expressed by the foregoing formula (8).

According to the modulator of the embodiment, as already described, adder 42 adds analog input signal X to signal component $(-(X+Q))$ provided from D/A converter 71, and supplies only error component $(-Q)$ to single-stage ΔΣ modulator 70. Therefore, the input of single-stage ΔΣ modulator 70 is substantially equal to half the original signal (X), and the stability of the modulator can be improved.

Quantized signal component (X+Q) provided from quantizer 41 is directly supplied to adder 44 without passing through single-stage ΔΣ modulator 70. Therefore, the intensity of input signal X can be maintained as it is, and the precision of the modulator can be improved.

The embodiment of the invention has been described in connection with the one-bit feedback method. However, the modulator may be of a multibit type, and another conversion method such as a feed-forward architecture may be employed. These type and method can achieve effects similar to those already described.

(Seventh Embodiment)

Figure 10:
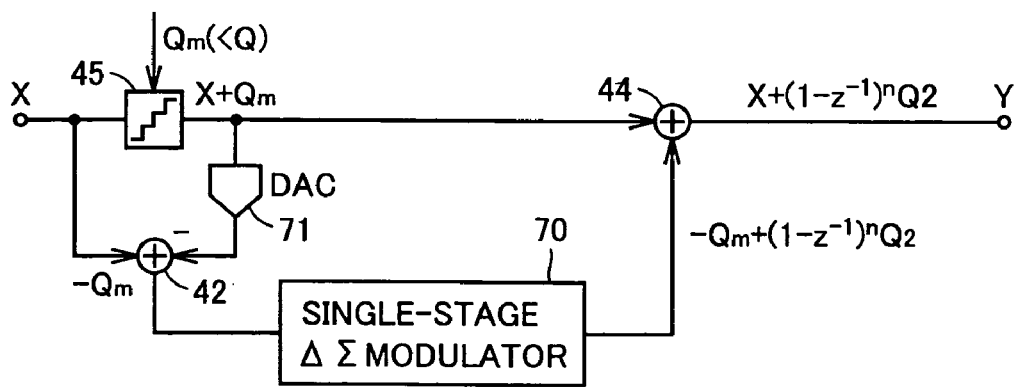

FIG. 10 is a block diagram showing a structure of a modulator of a seventh embodiment of the invention. This modulator differs from the modulator of the sixth embodiment shown in FIG. 9 only in that quantizer 41 is replaced with multibit quantizer (D/A converter) 45. Therefore, description of the same structures and functions is not repeated.

Multibit quantizer 45 quantizes analog input signal X to provide signal component (X+$Q_m$). Adder 42 adds analog input signal X to signal component (−(X+$Q_m$)) provided from D/A converter 71, and provides only error component (−$Q_m$) to single-stage ΔΣ modulator 43.

Single-stage ΔΣ modulator 43 provides an output of (−$Q_m$+(1−$z^{-1}$)$^n$·$Q_2$). Output signal Y is the same as that expressed by the formula (8) in the first embodiment already described.

According to the modulator of this embodiment, as described above, adder 42 adds input signal X to signal component (−(X+$Q_m$)) provided from D/A converter 71, and provides only error component (−$Q_m$) to single-stage ΔΣ modulator 70. Since quantization error $Q_m$ can be smaller than quantization error Q in the sixth embodiment, the input of single-stage ΔΣ modulator 70 can be further reduced so that the stability of the modulator can be further improved as compared with the modulator of the sixth embodiment.

(Eighth Embodiment)

Figure 11:
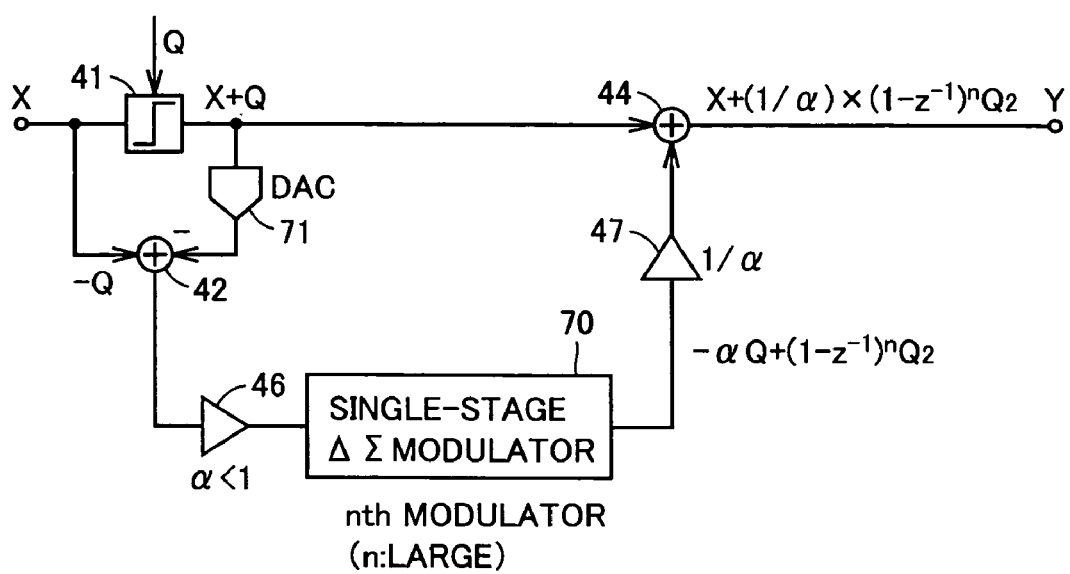

FIG. 11 is a block diagram showing a structure of a modulator of an eighth embodiment of the invention. This modulator differs from the modulator of the sixth embodiment shown in FIG. 9 only in that attenuator 46 having a coefficient of α smaller than one is arranged in a stage preceding single-stage ΔΣ modulator 70, and attenuator 47 having a coefficient of 1/α is arranged in a stage following single-stage ΔΣ modulator 70. Therefore, description of the same structures and functions is not repeated.

As the number n of order of single-stage ΔΣ modulator 70 is increased, the amplitude of output of the integrator in the final stage increases, and oscillation may occur, even if an input amplitude of single-stage ΔΣ modulator 70 decreases. For preventing it, attenuator 46 is added to a position preceding single-stage ΔΣ modulator 70.

Owing to attenuator 46 having coefficient of α, single-stage ΔΣ modulator 70 provides an output of (−αQ+(1−$z^{-1}$)$^n$·$Q_2$). Therefore, output signal Y is expressed by the formula (9) already described.

According to the modulator of the embodiment, as described above, attenuator 46 having a coefficient of α is added to the position preceding single-stage ΔΣ modulator 70, and attenuator 47 having a coefficient of (1/α) is added to the position following single-stage ΔΣ modulator 70. Therefore, it is possible to reduce an amplitude of the output of integrator 46-n in the final stage of single-stage ΔΣ modulator 70, and the oscillation of integrator 46-n can be prevented. Thus, it is possible to ensure the intended stability of the modulator while ensuring the intended amplitude of the modulator. The coefficient of α of attenuator 46 may be larger than the coefficient of attenuator 21 shown in FIG. 3 so that attenuator 46 may perform attenuation to a smaller extent.

(Ninth Embodiment)

Figure 12:
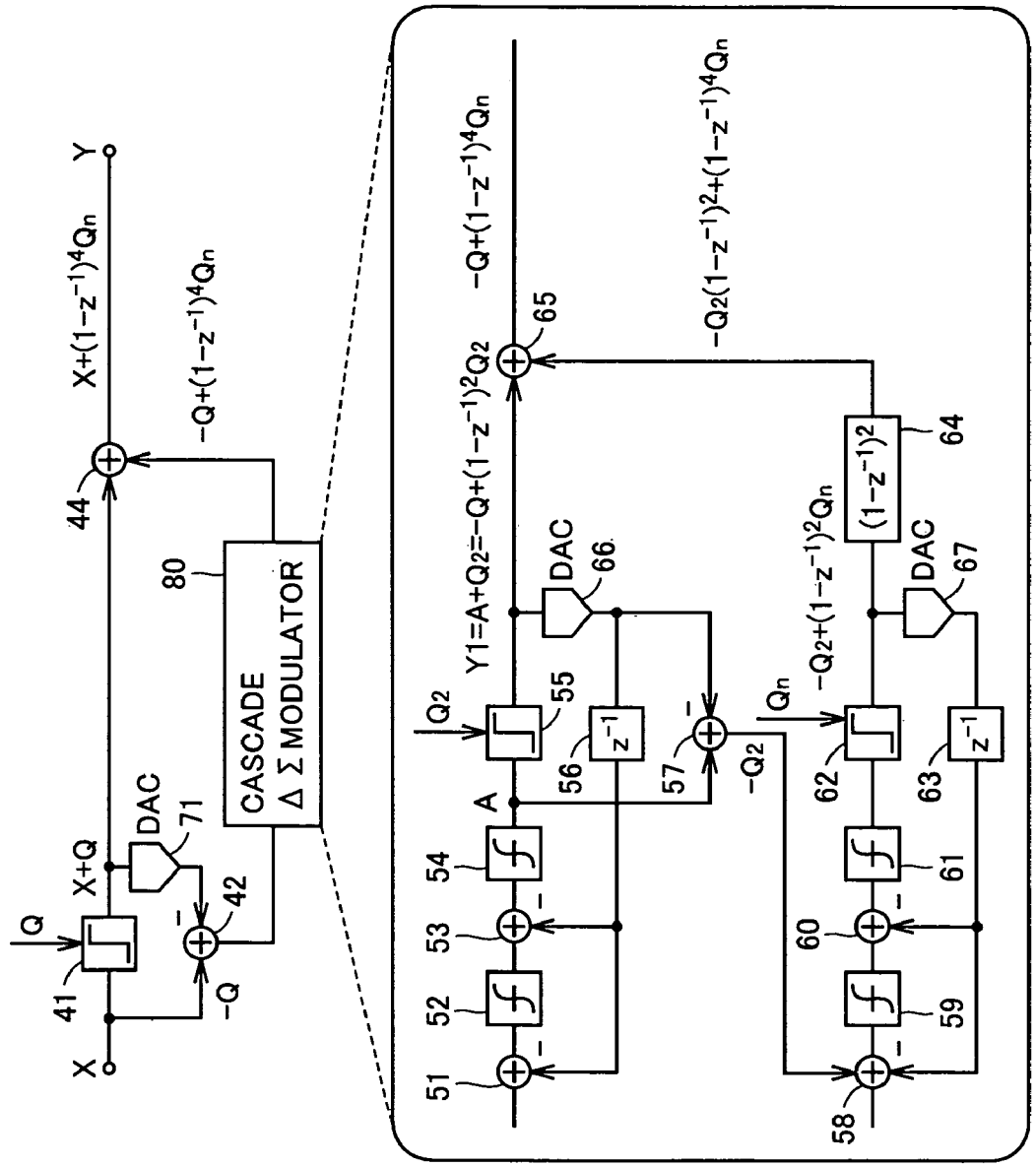

FIG. 12 is a block diagram showing a structure of a modulator of a ninth embodiment of the invention. This modulator differs from the modulator of the sixth embodiment shown in FIG. 9 only in that single-stage ΔΣ modulator 70 is replaced with a cascade ΔΣ modulator 80. Therefore, description of the same structures and functions is not repeated.

Cascade ΔΣ modulator 80 is formed of cascaded single-stage ΔΣ modulators, and includes adders 51, 53, 57, 58, 60 and 65, integrators 52, 54, 59 and 61, quantizers 55 and 62, delay elements 56 and 63, a differentiator 64 performing differentiation twice, and D/A converters 66 and 67.

Output Y1 of quantizer 55 is expressed by the foregoing formula (10), where A represents an input of quantizer 55, and $Q_2$ represents a quantization error of quantizer 55.

Adder 57 adds input A of quantizer 55 to an output (−(A+$Q_2$)) of D/A converter 66 to provide quantization error (−$Q_2$) of quantizer 55.

An output of quantizer 62 is expressed by (−$Q_2$+(1−$z^{-1}$)$^2$·$Q_n$) where $Q_n$ represents a quantization error of quantizer 62. Also, an output of differentiator 64 is expressed by (−$Q_2$*(1−$z^1$)$^2$+(1−$z^{-1}$)$^4$·$Q_n$). Therefore, adder 65 provides an output of (−$Q_2$+(1−$z^1$)$^4$·$Q_n$).

By the provision of the cascade ΔΣ modulator described above, quantization errors ($Q_2, Q_3, \ldots$) occurring in the quantizers except for that in the final stage can be removed by addition of those of the neighboring stages. Therefore, the item of (1/α) in the formula (9) of the fourth embodiment already described can be removed According to the modulator of this embodiment, as described above, cascade ΔΣ modulator 80 is used to modulate error component (−Q). Therefore, the amplitude of the output of integrator 61 in the final stage of cascade ΔΣ modulator 80 can be reduced without using an attenuator, and the oscillation in integrator 61 can be prevented. Thus, the stability of the modulator can be ensured while ensuring the amplitude of the modulator.

This embodiment has been described in connection with the case where two one-bit secondary ΔΣ modulators of the feedback type are cascaded. However, the number of cascaded stages may be increased, and/or a multibit quantizer may be employed as the quantizer in the final stage so that a modulator having higher precision can be achieved. Further, the conversion method of the modulator may employ another type such as a feed-forward type. In these cases, effects similar to those already described can be achieved.

(Tenth Embodiment)

Figure 13:
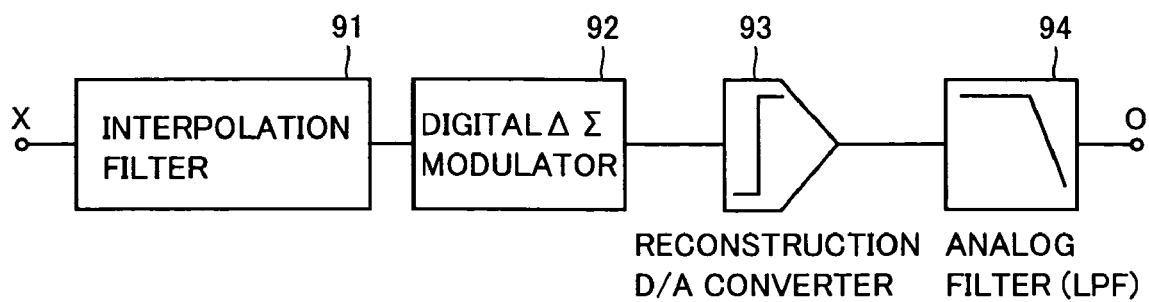
FIG. 13 is a block diagram showing a structure of a ΔΣ D/A converter according to a tenth embodiment of the invention.

FIG. 13 is a block diagram showing a structure of a ΔΣ D/A converter of a tenth embodiment of the invention. This ΔΣ D/A converter includes an interpolation filter 91, a digital ΔΣ modulator 92, a reconstruction D/A converter 93 and an analog filter (low-pass filter) 94. Reconstruction D/A converter 93 and analog filter 94 may be collectively referred to as an "analog filter".

Digital ΔΣ modulator 92 modulates digital input signal X, which is already subjected to interpolation by interpolation filter 91. Reconstruction D/A converter 93 and analog filter 94 convert digital output signal Y of digital ΔΣ modulator 92 to an analog signal.

Digital ΔΣ modulator 92 is the same as one of the modulators in the second to fifth embodiments already described. Therefore, it is possible to provide the ΔΣ D/A converter achieving the effects already described in connection with the second to fifth embodiments.

(Eleventh Embodiment)

Figure 14:
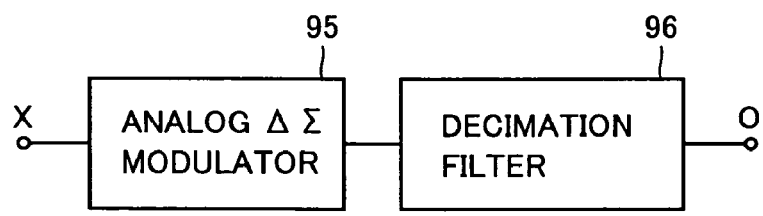
FIG. 14 is a block diagram showing a structure of a ΔΣ A/D converter according to an eleventh embodiment of the invention.

FIG. 14 is a block diagram showing a structure of a ΔΣ A/D converter in an eleventh embodiment of the invention. This ΔΣ A/D converter includes an analog ΔΣ modulator 95 and a decimation filter 96. Decimation filter 96 converts the output signal, which is already modulated by analog ΔΣ modulator 95, to multibit digital data, and performs downsampling to achieve an intended sample rate.

Analog ΔΣ modulator 95 is the same as one of those in the sixth to ninth embodiments already described. Therefore, it is possible to provide the ΔΣ A/D converter achieving the effects already described in connection with the sixth to ninth embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A modulator using a delta-sigma conversion method, and comprising:
   component separating unit separating a signal component and an error component of a digital input signal from each other, wherein said component separating unit includes a first guantizer quantizing the digital input signal, and an adder adding said digital input signal to said signal component provided from said first quantizer;
   single-stage delta-sigma modulator modulating the error component separated by said component separating unit;
   output operating unit operating the signal component separated by said component separating unit and the error component modulated by said single-stage delta-sigma modulator; and
   an attenuator connected between said adder and said single-stage delta-sigma modulator, and having a coefficient smaller than one,
   wherein said single-stage delta-sigma modulator includes:
      a plurality of integrators,
      a quantizer quantizing an output of an integrator in a final stage, and
      a delay element delaying an output of said quantizer to perform negative feedback by sending the delayed output to said plurality of integrators.

2. The modulator according to claim 1, wherein said single-stage delta-sigma modulator includes a plurality of single-stage delta-sigma modulators and said plurality of single-stage delta-sigma modulators are cascaded.

3. A modulator using a delta-sigma conversion method, and comprising:
   component separating unit separating a signal component and an error component of a digital input signal from each other;
   single-stage delta-sigma modulator modulating the error component separated by said component separating unit; and
   output operating unit operating the signal component separated by said component separating unit and the error component modulated by said single-stage delta-sigma modulator, wherein said component separating unit includes:
      a multibit quantizer quantizing the digital input signal to provide a multibit form, and
      an adder adding said digital input signal to said signal component provided from said multibit quantizer.

4. A modulator using a delta-sigma conversion method, and comprising:
   component separating unit separating a signal component and an error component of an analog input signal from each other;
   delta-sigma modulator modulating the error component separated by said component separating unit; and
   output operating unit operating the signal component separated by said component separating unit and the error component modulated by said delta-sigma modulator, wherein
   said component separating unit includes:
      a first quantizer quantizing the analog input signal,
      a first digital-to-analog converter converting said signal component provided from said first quantizer to a first analog signal, and
      an adder adding said analog input signal to said first analog signal provided from said first digital-to-analog converter,
   wherein
   said delta-sigma modulator includes:
      a plurality of integrators,
      a second quantizer quantizing an output of the integrator in the final stage,
      a second digital-to-analog converter converting an output of said second quantizer to a second analog signal, and
      a delay element delaying the second analog signal provided from said second digital-to-analog converter, and performing negative feedback by sending the delayed analog signal to said plurality of integrators.

5. The modulator according to claim 4, further comprising:
   an attenuator connected between said adder and said delta-sigma modulator, and having a coefficient smaller than one.

6. A modulator using a delta-sigma conversion method, and comprising:
   component separating unit separating a signal component and an error component of an input signal from each other;
   delta-sigma modulator modulating the error component separated by said component separating unit; and
   output operating unit operating the signal component separated by said component separating unit and the error component modulated by said delta-sigma modulator, wherein
   said component separating unit includes:
      a first quantizer quantizing an analog input signal,
      a first digital-to-analog converter converting said signal component provided from said first quantizer to an analog signal, and
      an adder adding said analog input signal to said analog signal provided from said first digital-to-analog converter, wherein
   said delta-sigma modulator includes a plurality of single-stage delta-sigma modulators each including:
      a plurality of integrators,
      a second quantizer quantizing an output of the integrator in the final stage, a second digital-to-analog converter converting an output of said second quantizer to an analog signal, and a delay element delaying the analog signal provided from said second digital-to-analog converter, and performing negative feedback by sending the delayed analog signal to said plurality of integrators; and said plurality of single-stage delta-sigma modulators are cascaded.

7. The modulator according to claim 6, further comprising:

an attenuator connected between said adder and said delta-sigma modulator, and having a coefficient smaller than one.

8. A modulator, using a delta-sigma conversion method, and comprising:

component separating unit separating a signal component and an error component of an analog input signal from each other;

delta-sigma modulator modulating the error component separated by said component separating unit; and output operating unit operating the signal component separated by said component separating unit and the error component modulated by said delta-sigma modulator, wherein said component separating unit includes:

a multibit quantizer quantizing the analog input signal to provide a multibit form, a digital-to-analog converter converting said signal component provided from said multibit quantizer to an analog signal, and an adder adding said analog input signal to the analog signal provided from said digital-to-analog converter.

* * * * *